United States Patent [19]

Gmitter et al.

[11] Patent Number: 4,751,200

[45] Date of Patent: Jun. 14, 1988

[54] PASSIVATION OF GALLIUM ARSENIDE SURFACES WITH SODIUM SULFIDE

[75] Inventors: Thomas J. Gmitter, Lakewood; Claude J. Sandroff, Tinton Falls; Eli Yablonovitch, Scotch Plains, all of N.J.

[73] Assignee: Bell Communications Research, Inc., Livingston, N.J.

[21] Appl. No.: 21,667

[22] Filed: Mar. 4, 1987

[51] Int. Cl.$^4$ ............... H01L 21/302; B05D 5/12; B32B 9/00

[52] U.S. Cl. ................... 437/225; 427/372.2; 427/430.1; 427/443.2; 428/688; 428/698; 428/699; 437/235

[58] Field of Search ............. 427/87, 82; 437/225

[56] References Cited

U.S. PATENT DOCUMENTS 4,320,178  3/1982  Chemla ........................... 427/87

4,354,198 10/1982 Hodgson et al. ..................... 357/16
4,632,886 12/1986 Teherani .............................. 426/698

FOREIGN PATENT DOCUMENTS 0179250  4/1986  European Pat. Off. ............. 427/82

Primary Examiner—Norman Morgenstern
Assistant Examiner—Margaret Burke
Attorney, Agent, or Firm—James W. Falk

[57] ABSTRACT

A method of passivating the surface of a gallium arsenide substrate by cleaning the gallium arsenide substrate in an etching solution and depositing a sulfide film on the substrate. The step of depositing the sulfide film is preferably performed by spin-on of a sodium sulfide solution, followed by drying or annealing. The resulting passivated surface exhibits superior surface recombination velocity characteristics compared to prior art passivation techniques, thereby making possible superior solid state device operating characteristics.

5 Claims, 1 Drawing Sheet

PASSIVATION OF GALLIUM ARSENIDE SURFACES WITH SODIUM SULFIDE

CROSS REFERENCE TO RELATED APPLICATION

This application is related to the concurrently filed and copending R. J. Nottenburg-C. J. Sandroff U.S. patent application Ser. No. 07/021,668 assigned to the assignee of the present application.

BACKGROUND OF THE INVENTION

1. Field of the Invention

This invention relates to the surface passivation of III-V type semiconductors and more particularly to the passivation of gallium arsenide.

2. Description of the Prior Art

Gallium arsenide and other III-V type semiconductors are attractive candidate materials for the fabrication of high performance semiconductor components. Although such materials offer the promise of high operational speed, they generally suffer from having surfaces with poor electronic qualities. One parameter which characterizes surface quality is the surface recombination velocity (So). Silicon surfaces ($S_o \sim 100$ cm/s) can be passivated by the development of a thermal oxide layer. However, attempts to surface passivate the III-V type semiconductors ($S_o \sim 10^6$ cm/s for GaAs) have not been entirely successful. The native oxide layers which can be formed on III-V compounds exhibit significant charge trapping under bias stress and, therefore, these native oxides are relatively ineffective as the surface passivation agent. In the case of gallium arsenide, growth of a native oxide layer leads to the formation of extrinsic defects yielding a high surface state density. In addition, most native III-V oxides are susceptible to environmental attack, for example, by moisture and oxygen.

Known surface passivation methods for III-V compound semiconductors which are made typically of GaAs may be divided roughly into three types.

The first method utilizes deposited films such as $SiO_2$, $Si_3N_4$, $Al_2O_3$ and $P_2O_5$ which are known from their use as passivation films for the surface of silicon semiconductors. Such an approach has the drawback that the deposition temperature is relatively high. $SiO_2$ film is most frequently used in view of the extensive practical knowledge concerning the deposition of such films in planar silicon semiconductor devices. However, $SiO_2$ films tend to absorb Ga from the surface of a substrate made of GaAs or GaP, and as a result such layers have the tendency to damage the stoichiometry of the surface of the substrate, leading to a high density of surface states and a large So.

The second method is to form a native oxide film corresponding to a thermal oxidation film of silicon, in place of the deposited film suggested above. For example, the anodic oxidation method has the advantage that an insulating thin film can be formed at a markedly low temperature as compared with the deposition method and also with the thermal oxidation method, irrespective of the instances wherein a solution is used or a gas plasma is used. Conversely, however, this anodic oxidation method has the disadvantage that it is thermally unstable, and therefore, it has the drawback that the quality of the film will change substantially at a temperature below the temperature range adopted for thermal diffusion of impurities and post-ion implantation annealing. Furthermore, the interface between an anodic oxide film and a substrate made of GaAs or GaP tends to contain a number of defects, so that when this film is utilized as an insulating film of an IG—FET (insulated - gate field effect transistor), there still cannot be obtained as yet a large value of surface mobility comparable with that within the bulk, and thus at the current technical stage, it is not possible for the anodic oxide film to fully display those advantages and features on applying it to the surface of GaAs and GaP substrates which are represented by high mobility as compared with a silicon substrate. In III-V semiconductors which essentially are binary compounds, a direct thermal oxidation of their surfaces has not yet produced any satisfactory results with respect to the quality of the film produced or to the state of interface. Such native oxide film has the further drawback that it is dissolved in acids such as HF, HCl, and $H_2SO_4$. Therefore, native oxide films inconveniently cannot be used in such manufacturing process as would comprise a number of steps.

The third approach is to perform chemical oxidation by the use of, for example, hot hydrogen peroxide solution. This method is entailed by limitation in the thickness of the oxide film which is formed, and accordingly the extent of application of this method is limited also.

The use of sulfides in connection with the passivation of semiconductor substrates is disclosed in two U.S. patents. U.S. Pat. No. 4,320,178 describes the use of an $A^{III}B^V$ sulfide for passivating an $A^{III}B^V$ semiconductor substrate, such as gallium arsenide. The sulfide is formed by a process of heating the substrate with sulfur or hydrogen sulfide.

U.S. Pat. No. 4,632,886 describes the use of an electrolyte solution of sulfide ions to provide a chemically passivation layer on mercury cadmium telluride semiconductor substrates. The description is limited to a discussion of that specific compound semiconductor, and the passivation layer is described as being mercury sulfide, cadmium sulfide, and tellurium sulfide. Passivation of gallium arsenide with sulfides is not described or suggested in such reference, and to the contrary is described as being obtained "by the formation of thermal oxides or nitrides."

Prior to the present invention there has not been a simple, easily implemented surface passivation technique for gallium arsenide and other III-V compounds which has been shown to achieve a sufficiently low surface recombination velocity for practical device applications.

SUMMARY OF THE INVENTION

Briefly, and in general terms, the invention provides a method of passivating the surface of a III-V semiconductor substrate by depositing a sulfide film on the entire substrate or on the portion of the substrate to be passivated. More particularly, the present invention consists of spin or dip coating a sodium sulfide film on the surface of a gallium arsenide substrate for passivation of such surface for electronic, optical, or electro-optical device applications.

The present invention also provides an article of manufacture consisting of a III-V semiconductor substrate and a layer of a sulfide on the substrate which functions to passivate the surface thereof for device applications.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENT

Figure 1:
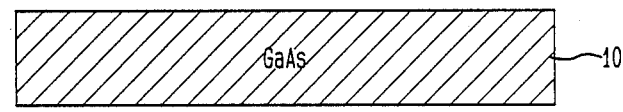
FIG. 1 is a highly simplified cross-sectional view of a gallium arsenide substrate.
Figure 2:
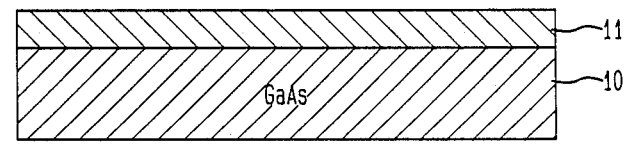
FIG. 2 is a highly simplified view of a sulfide passivation layer on the substrate formed according to the present invention.

Referring to FIG. 1, there is shown a crosssectional view of a substrate on which is to be formed active semiconductor devices or a composite of layered materials useful in implementing solid state electronic, optical, or electro-optical devices or structures. The substrate 10 may be of any suitable material, such as a semiconductor material or insulating substrate, and may be selected depending upon the specific solid state device to be implemented or the particular fabrication process employed. For purposes of this description, the substrate 10 is assumed to be gallium arsenide, either bulk gallium arsenide or a gallium arsenide compound on another substrate, such as silicon or sapphire. The gallium arsenide substrate may be of any suitable thickness, but is preferably about 15 mils for most integrated circuit applications.

The passivation treatment according to the present invention consists of two steps.

First, the substrate 10 is subjected to a cleaning step which is gentle etch preferably consisting of $H_2SO_4$:$H_2O_2$:$H_2O$ the proportions 1:8:500.

Second, a passivation step which consists of spin or dip coating a sodium sulfide $Na_2S$. $9H_2O$ on the surface of the substrate.

The process of film coating takes place by depositing a 1M aqueous solution of $Na_2S$. $9H_2O$ by spinning at 5000 RPM for 60 seconds. Such procedure leaves a colorless, crystalline film 11 whose thickness is a function of the $Na_2S$ . $9H_2O$ concentration. In order to achieve a film thickness of some 0.5 microns, which is preferred for most applications, a concentration of 0.5 to 1.0 Molar is appropriate. In addition to spin coating, roller coating or similar applications of the aqueous solution may be used as well.

The present invention is not limited to the use of a sodium sulfide solution since other sulfides such as lithium sulfide, potassium sulfide and like can be used as well, and such alternatives may be more appropriate for use with non-aqueous solvents, or for use in specific applications. The application of such sulfide films may also be performed by spin coating, roller coating, dip coating, or other techniques known in the art.

Following the application of the sulfide solution, the substrate may be dried in air or annealed in a heated atmosphere to form a permanent film layer on the surface of the substrate.

In order to determine the effect of the passivation layer on the performance of devices implemented on the gallium arsenide substrate, measurements were made of surface recombination velocity by techniques known to those skilled in the art. (See, e.g., S. D. Offsey, J. M. Woodall, A. C. Warren, P. D. Kirschner, T. I. Chappell and G. D. Pettit, Appl. Phys. Lett., 48, 475, 1986.)

A figure of merit for a semiconductor interface is the surface recombination velocity (SRV). The best prior art surface preparation was a photochemical method described in the Offsey paper noted above. The sodium sulfide method of surface preparation according to the present invention is 10 to 20 times superior (lower) in the SRV figure of merit than the prior art. It is anticipated that such operational characteristics would be valuable in GaAs transistors, photoreceptors and also in the passivation of quantum dots. Quantum "dots" are typically tiny GaAs containers implemented on a substrate for a single electron-hole pairs which are useful in all-optical communications devices.

While the invention has been illustrated and described as embodied in a process for passivation of gallium arsenide semiconductor surfaces, it is not intended to be limited to the details shown since various modifications and structural changes may be made without departing in any way from the spirit of the present invention.

It will be obvious to those skilled in the art that the process according to the present invention can be implemented with various semiconductor technologies and different combinations of known process steps, and that the preferred embodiments illustrated here are merely exemplary. It may be pointed out that other semiconductor materials, for example, $A_{III}$-$B_v$ compounds may be used. The thickness of the active and passivation layers, depth of penetration and gradation in concentration of various impurities in active layers and in particular the configuration and distance between the various layers, as well as the types of devices to which the process is applied can be chosen depending upon the desired properties. These and other variations can be further elaborated by those skilled in the art without departing from the scope of the present invention.

Without further analysis, the foregoing will so fully reveal the gist of the present invention that others can readily adapt it for various applications without omitting features that from the standpoint of prior art, fairly constitutes essential characteristics of the generic or specific aspects of this invention, and, therefore, such adaptations should and are intended to be comprehended within the scope and range of equivalence of the following claims.

What is claimed is :

1. A method of passivating the surface of a gallium arsenide substrate comprising the steps of:
   providing a gallium arsenide substrate;
   cleaning said substrate;
   depositing a sodium sulfide film on the surface of said substract to be passivated by application thereto of an aqueous solution of sodium sulfide; and
   annealing said substrate to form a passivation layer of sodium sulfide on the surface of said substrate, thereby minimizing the surface recombination velocity of said surface.

2. A method as defined in claim 1 wherein said steps of depositing a sulfide film is performed by spinning on said film at approximately 5000 rpm for 60 seconds.

3. A method as defined in claim 1 wherein said step of depositing a sulfide film is performed by dip coating said substrate in a sulfide solution.

4. A method as defined in claim 1 wherein said sulfide film is applied by roller coating.

5. An article of manufacture prepared by a process comprising the steps defined in claim 1.

* * * * *